US010658173B2

(12) United States Patent
Chang et al.

(10) Patent No.: US 10,658,173 B2
(45) Date of Patent: May 19, 2020

(54) METHOD FOR FABRICATING A SEMICONDUCTOR STRUCTURE ON A SEMICONDUCTOR WAFER

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW); Chieh-Te Chen, Kaohsiung (TW); Ching-Pin Hsu, Tainan (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 16/039,284

(22) Filed: Jul. 18, 2018

(65) Prior Publication Data
US 2020/0020524 A1 Jan. 16, 2020

(30) Foreign Application Priority Data
Jul. 10, 2018 (CN) .......................... 2018 1 0749597

(51) Int. Cl.
*H01L 21/02* (2006.01)
*H01L 21/3213* (2006.01)
*H01L 21/67* (2006.01)
*H01L 21/3065* (2006.01)
*H01L 27/108* (2006.01)

(52) U.S. Cl.
CPC .. *H01L 21/02252* (2013.01); *H01L 21/02087* (2013.01); *H01L 21/3065* (2013.01); *H01L 21/3213* (2013.01); *H01L 21/67063* (2013.01); *H01L 27/10897* (2013.01)

(58) Field of Classification Search
CPC ......... H01L 21/02087; H01L 21/02252; H01L 21/3065; H01L 21/30655; H01L 27/10894; H01L 21/3213; H01L 21/67063; H01L 27/10897
See application file for complete search history.

(56) References Cited

U.S. PATENT DOCUMENTS

| 6,913,520 | B1 | 7/2005 | Liao |
| 6,924,236 | B2 | 8/2005 | Yano |
| 8,278,189 | B2 | 10/2012 | Hsieh |
| 8,310,065 | B2 | 11/2012 | Wu |
| 8,603,908 | B2 | 12/2013 | Fischer |
| 9,484,207 | B2 * | 11/2016 | Her ................. H01L 21/28518 |
| 2007/0054490 | A1 | 3/2007 | Chen |
| 2008/0050923 | A1 | 2/2008 | Kim |

(Continued)

*Primary Examiner* — Eric A. Ward
(74) *Attorney, Agent, or Firm* — Winston Hsu

(57) ABSTRACT

A method for fabricating a semiconductor structure on a semiconductor wafer is disclosed. A semiconductor wafer having a first region, a second region, and a wafer bevel region is provided. The wafer bevel region has a silicon surface. A first semiconductor structure is formed in the first region and a second semiconductor structure is formed in the second region. The semiconductor wafer is subjected to a bevel plasma treatment to form a blocking layer only in the wafer bevel region. A silicidation process is then performed to form a silicide layer only in the first region and the second region.

9 Claims, 5 Drawing Sheets

(56) References Cited

U.S. PATENT DOCUMENTS

| | | | |
|---|---|---|---|
| 2010/0248463 A1* | 9/2010 | Letz | H01L 29/665 438/585 |
| 2014/0020708 A1* | 1/2014 | Kim | H01J 37/32091 134/1.1 |
| 2014/0273480 A1 | 9/2014 | Previtali | |
| 2017/0069726 A1* | 3/2017 | Kye | H01L 29/401 |

* cited by examiner

METHOD FOR FABRICATING A SEMICONDUCTOR STRUCTURE ON A SEMICONDUCTOR WAFER

BACKGROUND OF THE INVENTION

1. Field of the Invention

The present invention relates to the field of semiconductor fabrication technology, and more particularly to a method of fabricating a semiconductor structure such as a storage node contact structure and/or a contact plug on a semiconductor wafer.

2. Description of the Prior Art

In semiconductor processes, especially in the front-end process, a so-called silicidation process is often required to reduce the contact resistance by forming a metal silicide layer on the silicon surface.

However, according to the prior art method, a metal silicide layer is also formed in the wafer bevel region of the silicon wafer. The metal silicide layer formed in the wafer bevel region or the by-product formed in the subsequent etching process is likely to be peeled off within a chamber of an etching machine (for example, an etching chamber of the etching machine used to etch tungsten metal), which causes contamination problems of the etching machine and affects the reliability or yield of the process.

Accordingly, there is still a need in the art for an improved method to address the deficiencies and shortcomings of the prior art described above.

SUMMARY OF THE INVENTION

One object of the present invention is to provide an improved method for fabricating a semiconductor structure on a semiconductor wafer, which can avoid formation of a metal silicide layer in the wafer bevel region of the silicon wafer during the metal silicidation process, thereby solving the contamination problem of the etching machine, and improving the reliability or yield of the process.

In accordance with an embodiment of the present invention, the present invention provides a method of fabricating a semiconductor structure on a semiconductor substrate. First, a semiconductor wafer is provided having a first region, a second region, and a wafer bevel region. A first semiconductor structure and a second semiconductor structure are formed in the first region and the second region, respectively. Then, the semiconductor wafer is subjected to a bevel plasma treatment to form a blocking layer only in the wafer bevel region. A silicidation process is performed to form a metal silicide layer in the first region and the second region. For example, the blocking layer can be a silicon dioxide layer.

The first region may be a memory cell region, and the second region may be a peripheral circuit region. The first semiconductor structure includes a storage node contact structure of a memory cell, and the second semiconductor structure includes a source or drain contact structure of a transistor.

It is advantageous to use the present invention because by forming the blocking layer only in the wafer bevel region BR of the semiconductor wafer using the bevel plasma treatment before the metal silicidation process is performed, the formation of a metal silicide layer in the bevel region BR can be avoided during the metal silicidation process, and the contamination problem of the etching machine can be solved and the reliability or yield of the process is improved.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

Figure 1:
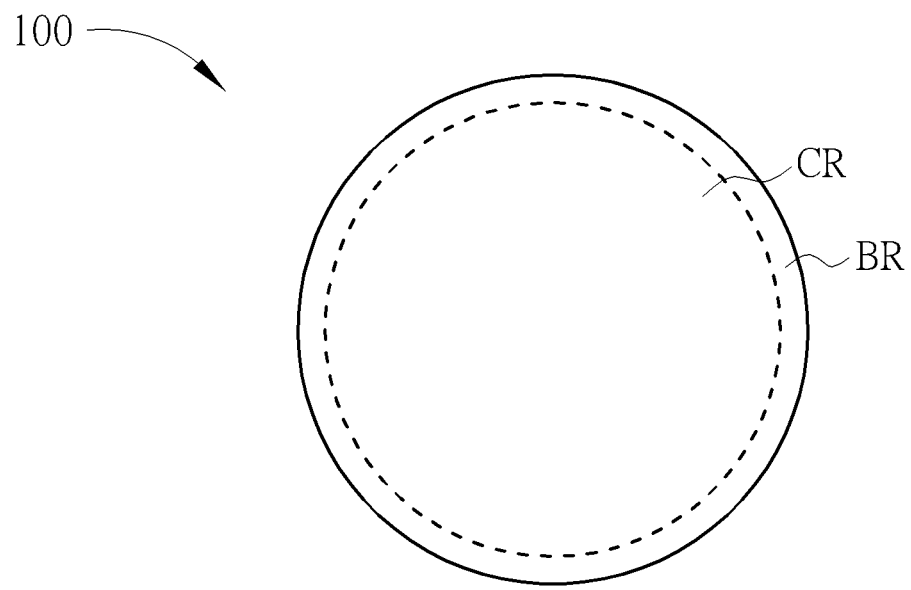
FIG. 1 illustrates a top view of a semiconductor wafer.
Figure 2:
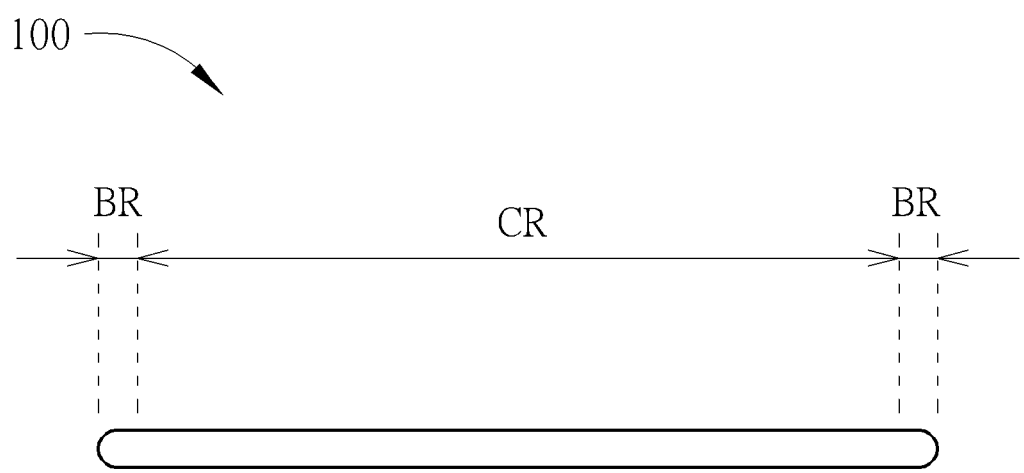
FIG. 2 is a schematic cross-sectional view of the semiconductor wafer in FIG. 1.

Please refer to FIG. 1 and FIG. 2. FIG. 1 illustrates a top view of a semiconductor wafer, and FIG. 2 is a cross-sectional view of the semiconductor wafer of FIG. 1. As shown in FIG. 1 and FIG. 2, the semiconductor wafer 100 has a disk-like structure having a central region CR and a wafer bevel region BR surrounding the central region CR. Taking a 12-inch wafer as an example, the wafer bevel region BR refers to an annular strip-shaped region having a width of about 1 mm to 3 mm (for example, 2 mm) along the perimeter of the semiconductor wafer 100. Semiconductor circuit components, such as transistors or a memory cells, may be formed in the central region CR. In the wafer bevel region BR, a semiconductor structure such as a transistor or a memory cell is usually not formed.

Figure 3:
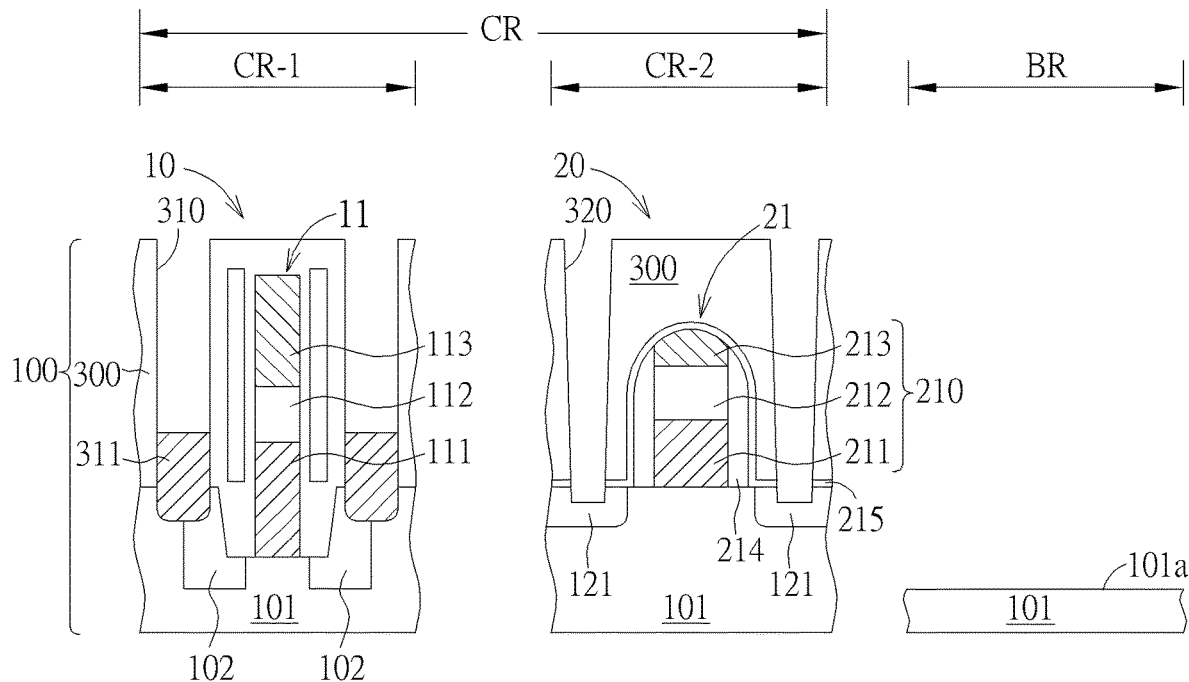
FIG. 3 to FIG. 9 are schematic cross-sectional diagrams showing a method of fabricating a semiconductor structure on a semiconductor wafer according to an embodiment of the invention.

FIG. 3 to FIG. 9 are schematic cross-sectional diagrams showing a method for fabricating a semiconductor structure on a semiconductor wafer according to an embodiment of the invention, wherein the same regions, elements and material layers are still labeled with the same numeral numbers. As shown in FIG. 3, a semiconductor wafer 100 is first provided, including a semiconductor substrate 101, such as a silicon substrate, having a first region CR-1, a second region CR-2, and a wafer bevel region BR. The first region CR-1 and the second region CR-2 are both located in the central region CR of FIG. 1 and FIG. 2. For example, the first region CR-1 may be a memory cell region, and the second region CR-2 may be a peripheral circuit region.

According to the embodiment of the invention, a plurality of memory cells or memory cell arrays may be formed in the memory cell region, and a transistor structure of the peripheral circuit may be formed in the peripheral circuit region. For the sake of simplify, only a single memory cell and a single transistor structure are shown.

As shown in FIG. 3, the first semiconductor structure 10 and the second semiconductor structure 20 have been formed on the semiconductor substrate 101 in the first region CR-1 and the second region CR-2, respectively. In accordance with an embodiment of the invention, the first semiconductor structure 10 includes a storage node contact structure 311 of a memory cell. According to an embodiment of the invention, the first semiconductor structure 10 comprises a bit line structure 11 disposed in a dielectric layer 300 and may extend into the semiconductor substrate 101.

In the dielectric layer 300 beside the bit line structure 11, a storage node contact hole 310 is formed, and the storage node contact structure 311 is located at the bottom of the storage node contact hole 310 and is in direct contact with a portion of the semiconductor substrate 101. The storage node contact structure 311 does not fill up the storage node contact hole 310. Within the semiconductor substrate 101, a device isolation region 102, such as a shallow trench isolation (STI) region, is provided for isolating the devices. According to an embodiment of the invention, the storage node contact structure 311 may comprise amorphous Si or polysilicon. According to an embodiment of the present invention, the bit line structure 11 may include a polysilicon layer 111, a tungsten layer 112, and a cap layer 113, but is not limited thereto.

According to an embodiment of the invention, the second semiconductor structure 20 includes a source or drain contact structure 320 of a transistor 21, or a contact hole that exposes a portion of the source or drain region 121 within the semiconductor substrate 101. According to an embodiment of the invention, the transistor 21 includes a gate structure 210, for example, a stack of a polysilicon layer 211, a tungsten layer 212, and a cap layer 213. A spacer 214 may be formed on the sidewall of the gate structure 210, and a contact etch stop layer 215 may be formed on the transistor 21. A dielectric layer 300 is formed on the contact etch stop layer 215.

The fabrication processes of the bit line structure 11, the storage node contact structure 311, the gate structure 210, the source or drain region 121, the contact etch stop layer 215, the dielectric layer 300, and the source or drain contact structure 320 are well known, so the details are not described further. According to an embodiment of the present invention, after the first semiconductor structure 10 and the second semiconductor structure 20 are respectively formed on the semiconductor substrate 101 in the first region CR-1 and the second region CR-2, the silicon surface 101a of the semiconductor substrate 101 in the wafer bevel region BR is exposed at this point.

Figure 4:
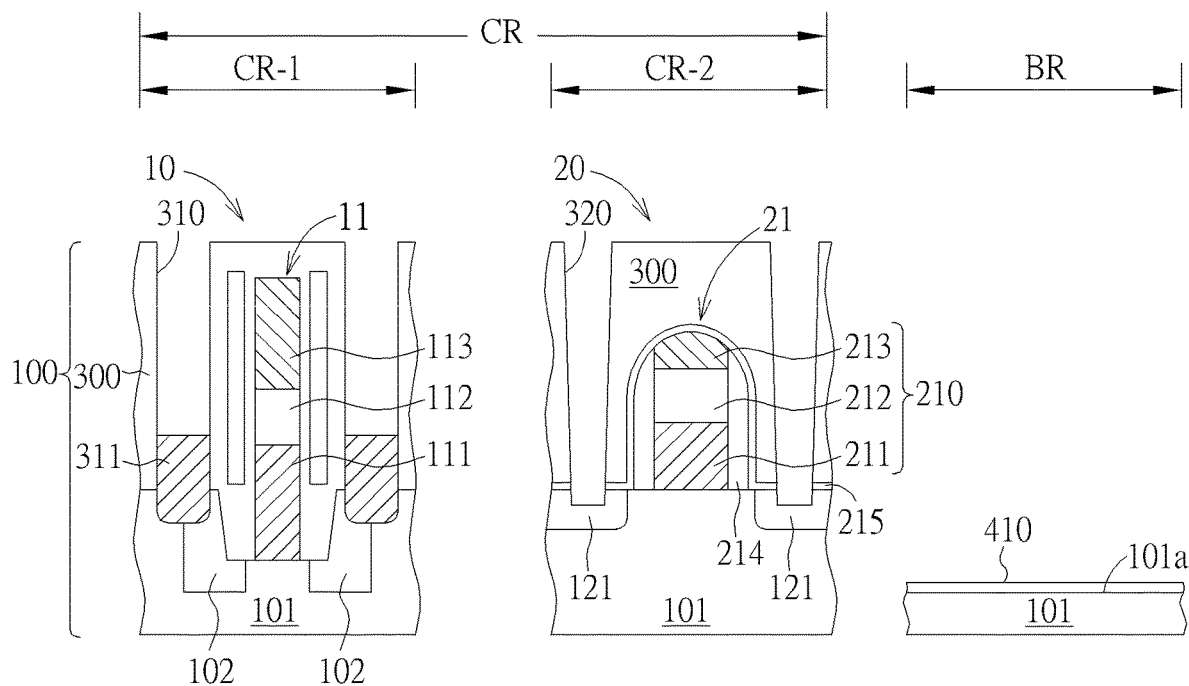

As shown in FIG. 4, a bevel plasma treatment process is then performed on the semiconductor wafer 100, and a blocking layer 410 is formed only in the wafer bevel region BR. According to an embodiment of the invention, the blocking layer 410 is a silicon dioxide layer. The silicon dioxide layer is formed by oxidizing the silicon surface 101a in the wafer bevel region BR during the bevel plasma treatment process, and has a thickness of about 10 angstroms to 20 angstroms, but is not limited thereto. The blocking layer 410 needs to be thick enough to avoid reaction of the subsequent deposition of a metal layer (e.g., cobalt or nickel) with the underlying silicon surface 101a.

Figure 10:
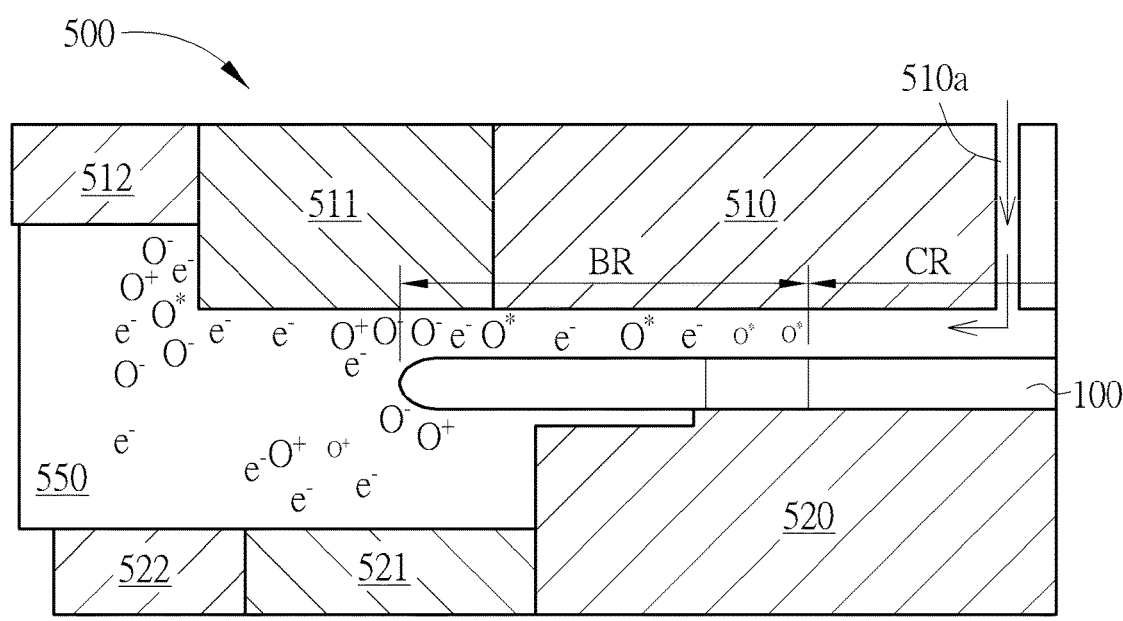
FIG. 10 is a schematic diagram showing bevel plasma treatment for a semiconductor wafer.

Please refer to FIG. 10, which is a schematic diagram of a bevel plasma treatment process for a semiconductor wafer. According to an embodiment of the invention, during the bevel plasma treatment process, the semiconductor wafer 100 is placed in a plasma bevel etcher 500 equipped with a plasma exclusion zone (PEZ) ring. As shown in FIG. 10, the plasma bevel etcher 500 includes an upper PEZ ring 511 and a lower PEZ ring 521 adjacent to the wafer bevel region BR of the semiconductor wafer 100. The semiconductor wafer 100 is placed on a wafer stage 520. For example, the wafer stage 520 may comprise a vacuum chuck or an electrostatic chuck (E-chuck).

According to an embodiment of the present invention, the upper PEZ ring 511 may be disposed around an upper metal member 510 such that the upper metal member 510 is flush with the lower surface of the upper PEZ ring 511 and is kept a predetermined distance from the semiconductor wafer 100. The upper metal member 510 may be made of aluminum, and its surface may be anodized. Inside the upper metal member 510, there may be a gas inlet 510a for supplying a predetermined gas to control the diffusion of the plasma gas. An upper electrode 512 may be disposed around the upper PEZ ring 511, and a lower electrode 522 may be disposed around the lower PEZ ring 521 to provide an electric field of a predetermined power sufficient to generate plasma in the reaction chamber 550 and diffusion to the wafer bevel region BR.

According to an embodiment of the present invention, the bevel plasma treatment process may utilize oxygen gas plasma. To control the diffusion of oxygen plasma, a gas is supplied from the gas inlet 510a. Through the adjustment of the upper PEZ ring 511 and the lower PEZ ring 521, the oxygen plasma only reacts with the wafer bevel region BR of the semiconductor wafer 100 to form a silicon dioxide blocking layer. However, the present invention is not limited to the example in which the blocking layer 410 is a silicon dioxide layer. In other embodiments, the plasma composition (for example, nitrogen, oxygen, carbon monoxide, carbon dioxide, etc.) can be adjusted to obtain a blocking layer 410 of different compositions. For example, the blocking layer 410 may comprise silicon oxynitride (SiON), silicon oxycarbide (SiCO), silicon nitride, or silicon carbide.

Figure 5:
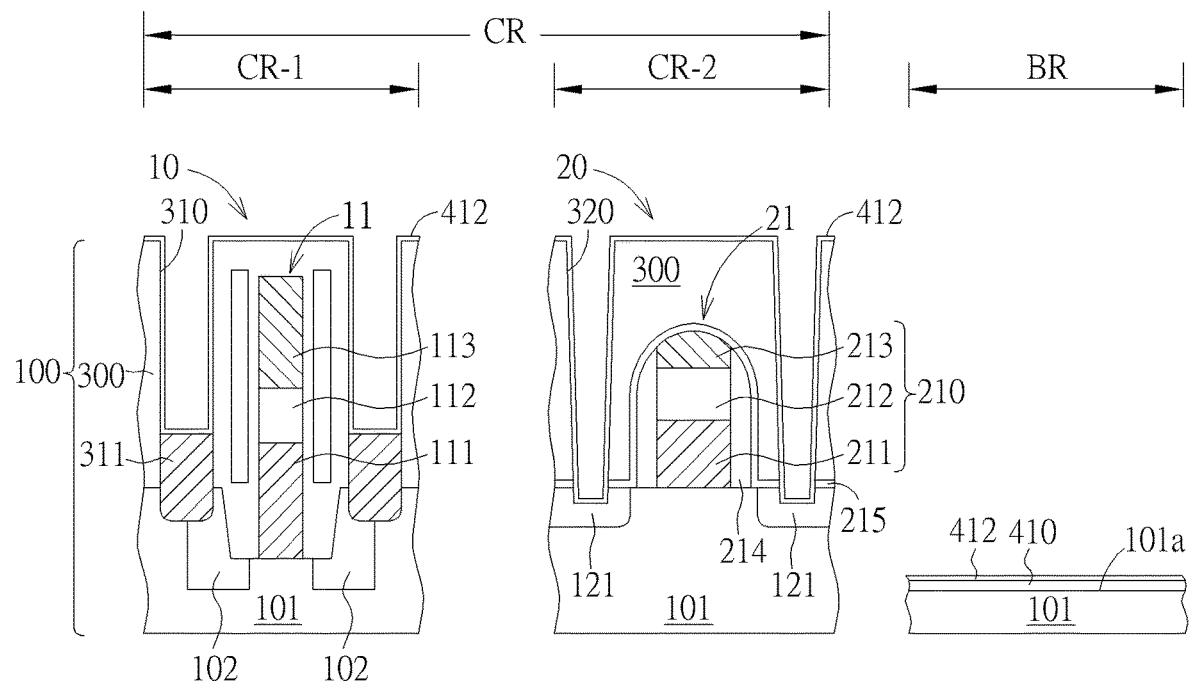
Figure 6:
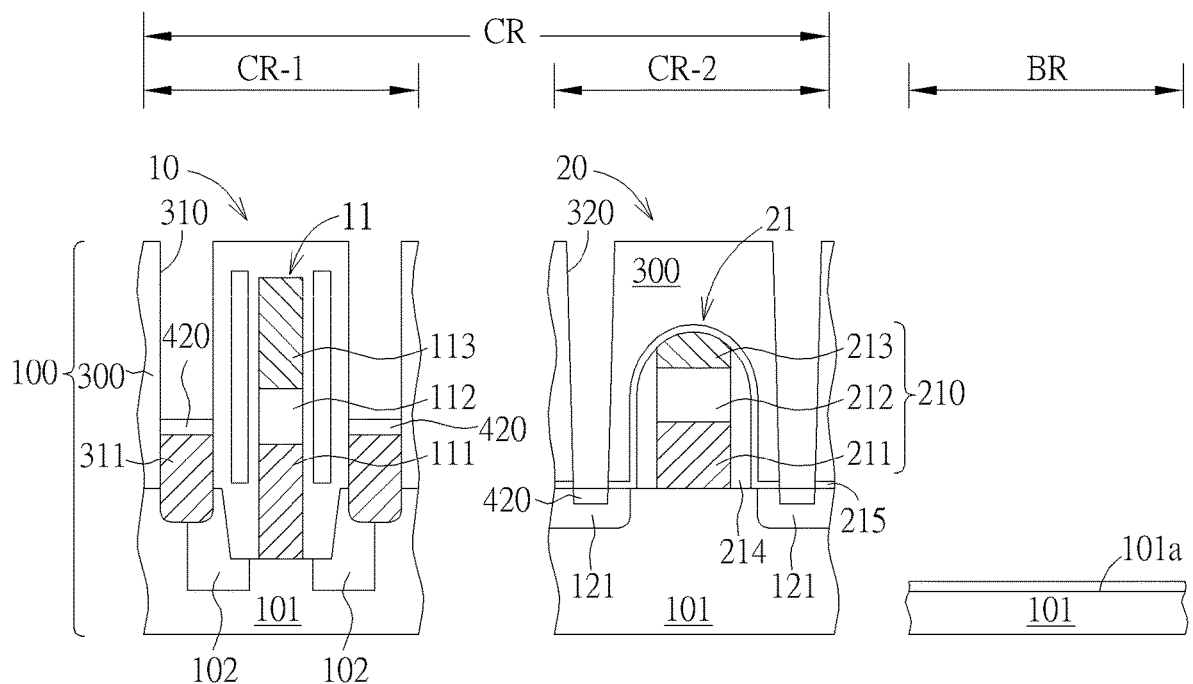

As shown in FIG. 5 and FIG. 6, subsequently, a silicidation process is performed.

First, as shown in FIG. 5, a metal film 412, for example, a cobalt film or a nickel film, is formed in a blanket manner in the first region CR-1 and the second region CR-2, and on the blocking layer 410 in the wafer region BR. The metal film 412 is conformally deposited on the interior surface of the storage node contact hole 310 in the first region CR-1, the surface of the storage node contact structure 311, and the bit line structure 11 by a deposition method such as an atomic layer deposition (ALD) method. The metal film 412 is conformally deposited on the surface of the source or drain contact structure 320 and the dielectric layer 300 in the second region CR-2.

As shown in FIG. 6, a thermal process, such as rapid thermal process (RTP), is performed such that the metal film 412 reacts with the silicon surface in the storage node contact hole 310 and in the source or drain contact structure 320, respectively, to form the metal silicide layer 420. Since the blocking layer 410 covers the silicon surface 101a of the wafer bevel region BR, the metal film 412 does not react with the silicon surface 101a of the wafer bevel region BR and a metal silicide layer is not formed in the wafer bevel region BR.

Next, the unreacted metal film 412 is removed from the first region CR-1 and the second region CR-2 and is removed from the blocking layer 410 in the wafer bevel region BR by etching, for example, using a sulfuric acid solution, leaving the metal silicide layer 420 only in the first region CR-1 and the second region CR-2. According to an embodiment of the invention, the metal silicide layer 420 may comprise cobalt silicide or nickel silicide.

Figure 7:
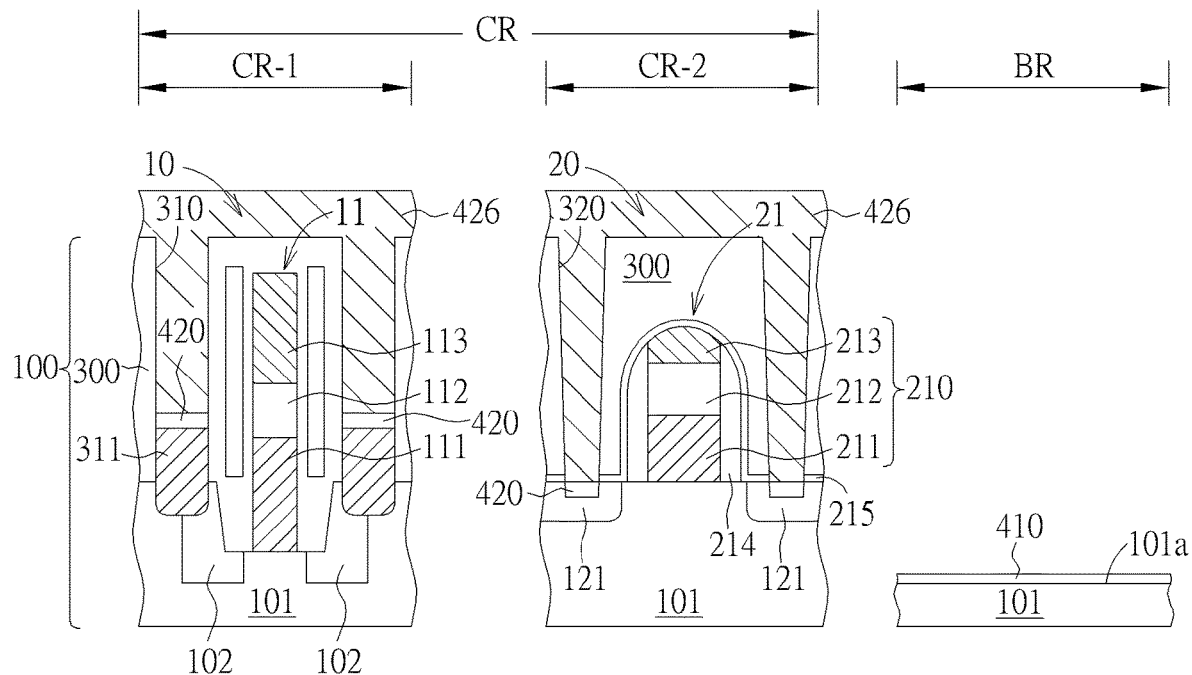
Figure 8:
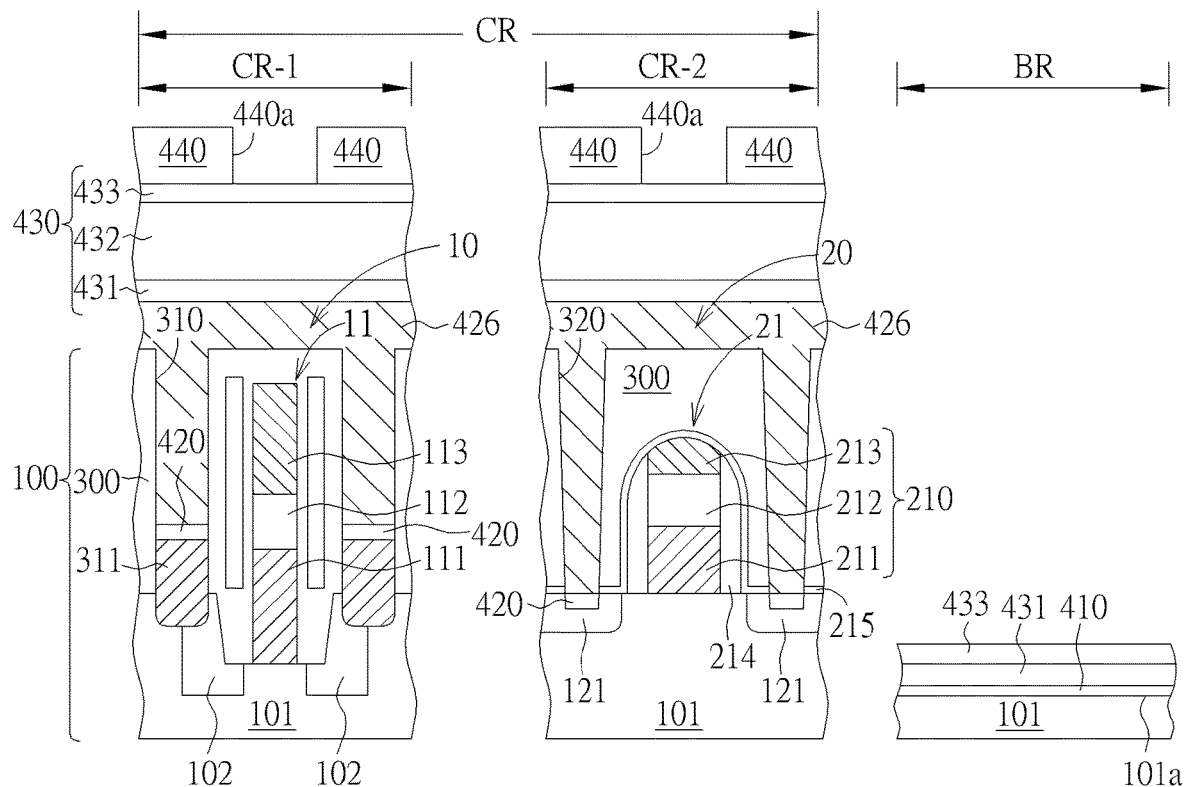
Figure 9:
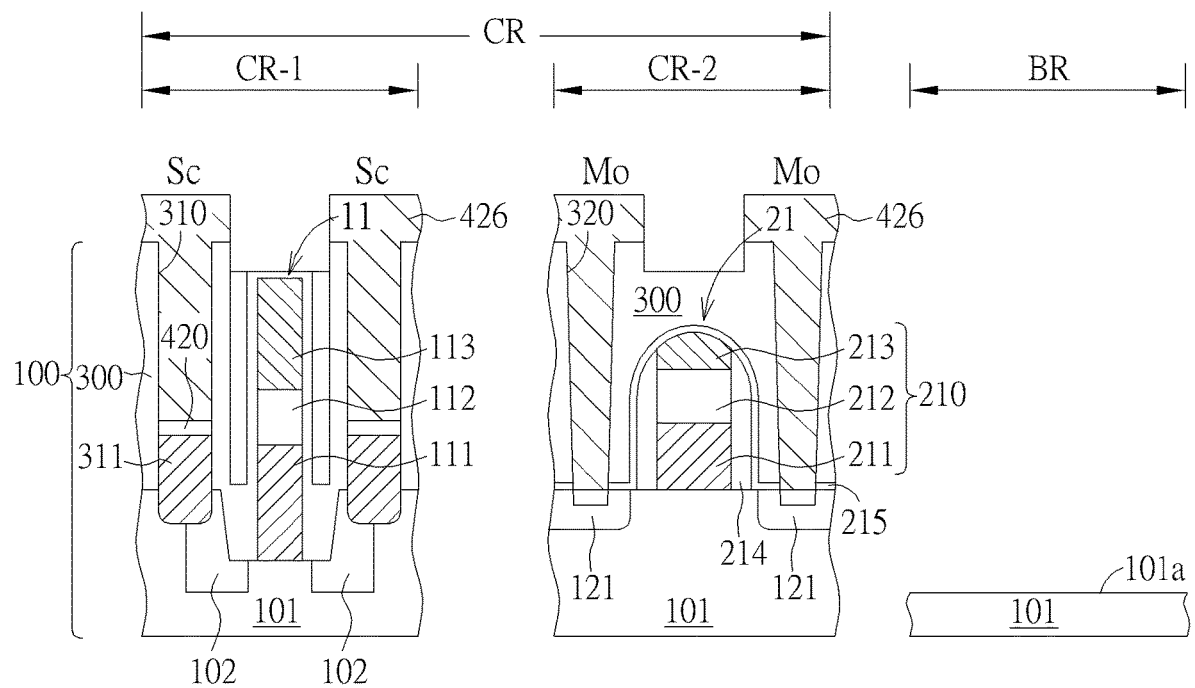

Next, as shown in FIG. 7 to FIG. 9, after the foregoing metal silicide process is completed and the metal silicide layer 420 is formed in the first region CR-1 and the second region CR-2, the fabrication of the storage node pads in the first region CR-1 and the contact plugs in the second region CR-2 is then performed.

As shown in FIG. 7, a conductive layer 426, for example, a tungsten layer, is selectively deposited only in the first region CR-1 and the second region CR-2. The conductive layer 426 fills the storage node contact hole 310 in the first region CR-1 and is indirect contact with the metal silicide layer 420, and the conductive layer 426 fills the source or drain contact structure 320 in the second region CR-2. The conductive layer 426 is not formed in the wafer bevel region BR, so that the blocking layer 410 in the wafer bevel region BR is exposed at this point.

As shown in FIG. 8, a pattern transfer stacked layer 430 is further deposited in the first region CR-1, the second region CR-2, and the wafer bevel region BR. For example, the pattern transfer stacked layer 430 may comprise a silicon nitride layer 431, an organic dielectric layer (ODL) 432 and a silicon-containing hard mask bottom anti-reflective coating (SHB) layer 433, but are not limited to. Then, a photoresist pattern 440 is formed on the pattern transfer stacked layer 430. The photoresist pattern 440 includes an opening 440a that exposes a portion of the surface of the pattern transfer stacked layer 430.

As shown in FIG. 9, an anisotropic dry etching process is performed to pattern the conductive layer 426 to form a storage node pad SC in the first region CR-1 and a contact plug CP and a $M_0$ metal layer in the second region CR-2, and the silicon surface 101a is exposed in the wafer bevel region BR. During the aforementioned pattern transferring process, the silicon nitride layer 431 and the SHB layer 433 which are originally formed in the wafer bevel region BR are removed, so that the silicon surface 101a is exposed.

It is advantageous to use the present invention because by forming the blocking layer only in the wafer bevel region BR of the semiconductor wafer using the bevel plasma treatment before the metal silicidation process is performed, the formation of a metal silicide layer in the bevel region BR can be avoided during the metal silicidation process, and the contamination problem of the etching machine can be solved and the reliability or yield of the process is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor structure on a semiconductor wafer, comprising:

providing a semiconductor wafer comprising a first region, a second region, and a wafer bevel region, wherein the wafer bevel region comprises a silicon surface;

forming a first semiconductor structure in the first region and a second semiconductor structure in the second region;

subjecting the semiconductor wafer to a bevel plasma treatment to form a blocking layer only in the wafer bevel region; and performing a silicidation process to form a silicide layer only in the first region and the second region;

depositing a conductive layer only in the first region and the second region; and patterning the conductive layer in the first region into a storage node pad and patterning the conductive layer in the second region into a contact plug and $M_0$ metal layer, while revealing the silicon surface of the wafer bevel region.

2. The method according to claim 1, wherein the first region is a memory cell region and the second region is a peripheral circuit region.

3. The method according to claim 2, wherein the first semiconductor structure is a storage node contact structure of a memory cell and the second semiconductor structure is a source/drain contact structure of a transistor.

4. The method according to claim 1, wherein the blocking layer is a silicon dioxide layer.

5. The method according to claim 4, wherein the silicon dioxide layer is formed by oxidizing the silicon surface of the wafer bevel region during the bevel plasma treatment.

6. The method according to claim 1, wherein during the bevel plasma treatment, the semiconductor wafer is placed in a plasma bevel etcher equipped with a plasma exclusion zone (PEZ) ring.

7. The method according to claim 1, wherein the blocking layer comprises silicon oxynitride (SiON), silicon oxycarbide (SiCO), silicon nitride, or silicon carbide.

8. The method according to claim 1, wherein the silicidation process comprises:

forming a metal film in the first region, the second region, and on the blocking layer in the wafer bevel region in a blanket manner;

performing a thermal process to generate the silicide layer only in the first region and the second region; and removing unreacted portions of the metal film from the first region, the second region, and from the blocking layer in the wafer bevel region.

9. The method according to claim 1, wherein the silicide layer comprises cobalt silicide or nickel silicide.

* * * * *